(12) United States Patent
Weigert (10) Patent No.: US 9,142,746 B2
(45) Date of Patent: Sep. 22, 2015

(54) LIGHT-EMITTING DIODES ON A WAFER-LEVEL PACKAGE

(71) Applicant: Avago Technologies General IP (Singapore) Pte. Ltd., Singapore (SG)

(72) Inventor: Martin Weigert, Etterzhausen (DE)

(73) Assignee: Avago Technologies General IP (Singapore) Pte. Ltd. (SG)

( * ) Notice: Subject to any disclaimer, the term of this patent is extended or adjusted under 35 U.S.C. 154(b) by 0 days.

(21) Appl. No.: 14/076,677

(22) Filed: Nov. 11, 2013

(65) Prior Publication Data

US 2015/0129906 A1 May 14, 2015

(51) Int. Cl.
*H01L 33/62* (2010.01)
*H01L 27/15* (2006.01)
*H01L 33/54* (2010.01)

(52) U.S. Cl.
CPC ............... *H01L 33/62* (2013.01); *H01L 27/15* (2013.01); *H01L 33/54* (2013.01)

(58) Field of Classification Search
None
See application file for complete search history.

(56) References Cited

U.S. PATENT DOCUMENTS

| | | | |
|---|---|---|---|
| 4,713,841 A * | 12/1987 | Porter et al. | 398/191 |
| 7,048,450 B2 | 5/2006 | Beer et al. | |
| 7,170,049 B2 | 1/2007 | Iwanczyk et al. | |
| 7,536,066 B2 | 5/2009 | Kato et al. | |
| 8,064,739 B2 | 11/2011 | Binkert et al. | |
| 8,642,385 B2 | 2/2014 | Xue et al. | |
| 8,642,397 B1 | 2/2014 | Gong et al. | |
| 2004/0057648 A1 | 3/2004 | Yunus | |
| 2004/0069997 A1 | 4/2004 | Dair et al. | |
| 2004/0259282 A1 * | 12/2004 | Oohata | 438/34 |
| 2008/0122122 A1 * | 5/2008 | Wong et al. | 257/787 |
| 2008/0186702 A1 * | 8/2008 | Camras et al. | 362/231 |
| 2010/0316184 A1 | 12/2010 | Iwanczyk et al. | |
| 2011/0193241 A1 | 8/2011 | Yen et al. | |
| 2011/0194265 A1 | 8/2011 | Su et al. | |
| 2012/0220082 A1 | 8/2012 | Ng et al. | |
| 2013/0001795 A1 * | 1/2013 | Lim et al. | 257/774 |
| 2013/0241077 A1 | 9/2013 | Fuergut et al. | |
| 2013/0264684 A1 | 10/2013 | Yu et al. | |
| 2013/0320471 A1 | 12/2013 | Luan | |

OTHER PUBLICATIONS

"dWLB Embedded Wafer-Level Ball Grid Array", STATS ChipPAC Ltd. Singapore, Aug. 2011, 1-2.
"Wafer Level Chip Scale Package (WLCSP)", Freescale Semiconductor Application Note, Aug. 2009, 16 pages.
"Kitronik Ltd—5mm RGB LED Common Anode", Technology Data Sheet & Specifications, http://www.kitronik.co.uk, 3 pages.
"SiliconCore LED Display Products", www.silicon-core.com, SiliconCore Technology, Inc., Jan. 4, 2013, 53 pages.
"BLINKM Datasheet", blinkm.thingm.com, v20100810, THINGM Labs, 50 pages.
"Renesas to Commercialize FO-WLP technology in MCU product line by 2011," I-Micronews, Oct. 20, 2010, 2 pages [retrieved from: http://www.i-micronews.com/advanced-packaging-news/1859-renesas-to-commercialize-fo-wlp-technology-in-mcu-product-line-by-2011.html].
Bottoms et al. "A description of what will specifically be needed to support continuation of the rapid pace of proogress achieved by the electronics industry." Future Fab International, ITRS Chapter: Assembly & Packaging, Jan. 12, 2012, Issue 40, 7 pages [retrieved from http://www.future-fab.com/documents.asp?d_ID=4912].

* cited by examiner

*Primary Examiner* — Charles Garber
*Assistant Examiner* — Alia Sabur (57) ABSTRACT

A light emitter and methods of constructing the same is disclosed. The light emitter is disclosed as including a jumper chip and one or more light sources, such as Light Emitting Diodes (LEDs). The light sources are connected to the jumper chip via conductive traces manufactured with semiconductor processing techniques. The jumper chip is disclosed as having a plurality of isolated conductive vias, thereby allowing the jumper chip to present multiple different bonding areas that are electrically isolated from one another.

21 Claims, 7 Drawing Sheets

LIGHT-EMITTING DIODES ON A WAFER-LEVEL PACKAGE

FIELD OF THE DISCLOSURE

The present disclosure is generally directed toward Light Emitting Diodes (LEDs) and specifically directed toward packages for LEDs.

BACKGROUND

Light Emitting Diodes (LEDs) have many advantages over conventional light sources, such as incandescent, halogen and fluorescent lamps. These advantages include longer operating life, lower power consumption, and smaller size. Consequently, conventional light sources are increasingly being replaced with LEDs in traditional lighting applications. As an example, LEDs are currently being used in flashlights, camera flashes, traffic signal lights, automotive taillights, consumer electronics (e.g., mobile phones, smart phones, etc.), and display devices. LEDs are also becoming more prevalent in residential, commercial, and industrial lighting applications.

As a general trend, a very compact and small package for light sources is desired for consumer electronics such as mobile phones, smart phones, etc. The state of the art package today uses a carrier such as a leadframe, Printed Circuit Board (PCB), ceramic or silicon carrier etc. as a mounting base for the bare die LED. Normally a LED has two contacts, a p- and n-contact, and the two contacts are usually on opposing sides of the LED die. Accordingly, one contact is normally contacted with conductive glue to the carrier and the other one (e.g., the contact on the opposing side of the LED die) is connected to the carrier via a bond wire. As can be appreciated, this type of packaging scheme places a physical limit on the package size, or more specifically how small the package can be produced.

BRIEF DESCRIPTION OF THE DRAWINGS

The present disclosure is described in conjunction with the appended figures, which are not necessarily drawn to scale.

DETAILED DESCRIPTION

Various aspects of the present disclosure will be described herein with reference to drawings that are schematic illustrations of idealized configurations. As such, variations from the shapes of the illustrations as a result, for example, manufacturing techniques and/or tolerances, are to be expected. Thus, the various aspects of the present disclosure presented throughout this document should not be construed as limited to the particular shapes of elements (e.g., regions, layers, sections, substrates, etc.) illustrated and described herein but are to include deviations in shapes that result, for example, from manufacturing. By way of example, an element illustrated or described as a rectangle may have rounded or curved features and/or a gradient concentration at its edges rather than a discrete change from one element to another. Thus, the elements illustrated in the drawings are schematic in nature and their shapes are not intended to illustrate the precise shape of an element and are not intended to limit the scope of the present disclosure.

It will be understood that when an element such as a region, layer, section, substrate, or the like, is referred to as being "on" another element, it can be directly on the other element or intervening elements may also be present. In contrast, when an element is referred to as being "directly on" another element, there are no intervening elements present. It will be further understood that when an element is referred to as being "formed" or "established" on another element, it can be grown, deposited, etched, attached, connected, coupled, or otherwise prepared or fabricated on the other element or an intervening element.

Furthermore, relative terms, such as "lower" or "bottom" and "upper" or "top" may be used herein to describe one element's relationship to another element as illustrated in the drawings. It will be understood that relative terms are intended to encompass different orientations of an apparatus in addition to the orientation depicted in the drawings. By way of example, if an apparatus in the drawings is turned over, elements described as being on the "lower" side of other elements would then be oriented on the "upper" side of the other elements. The term "lower" can, therefore, encompass both an orientation of "lower" and "upper" depending of the particular orientation of the apparatus. Similarly, if an apparatus in the drawing is turned over, elements described as "below" or "beneath" other elements would then be oriented "above" the other elements. The terms "below" or "beneath" can therefore encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and this disclosure.

As used herein, the singular forms "a," "an," and "the" are intended to include the plural forms as well, unless the context clearly indicates otherwise. It will be further understood that the terms "comprise," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items.

Furthermore, various descriptive terms used herein, such as "transparent" should be given the broadest meaning possible within the context of the present disclosure. For example, something that is described as being "transparent" should be understood as having a property allowing no significant obstruction or absorption of electromagnetic radiation in the particular wavelength (or wavelengths) of interest, unless a particular transmittance is provided.

Figure 1:
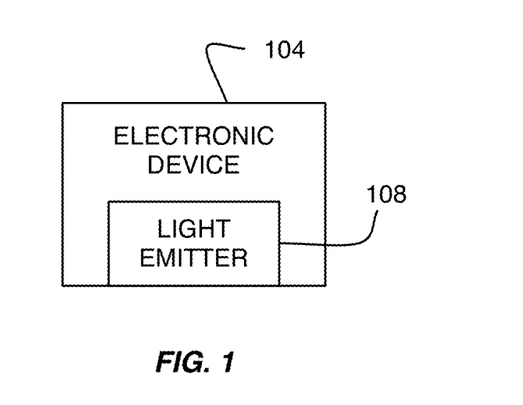
FIG. 1 is block diagram depicting an illustrative electronic device with light emitter in accordance with embodiments of the present disclosure.

It is with respect to the above-noted shortcomings that embodiments of the present disclosure were envisioned. With reference initially to FIG. 1, an electronic device 104 is depicted as including a light emitter 108. The electronic device 104 may correspond to any type of device comprising electronic, mechanical, electromechanical, or similar types of components. Non-limiting examples of electronic devices 104 include consumer electronic devices (e.g., mobile phones, smart phones, tablets, Personal Computers (PCs), laptops, televisions, etc.), commercial electronic devices, industrial electronic devices, large displays, billboards, and the like.

The light emitter 108, as will be discussed herein, may comprise one or many light sources. In some embodiments, the light emitter 108 may comprise one or more of the following: LEDs, laser diodes, photodiodes, photodiode Integrated Circuits (ICs), Vertical-Cavity Surface-Emitting Laser (VCSEL), or the like. Where the light emitter 108 comprises a plurality of LEDs, the LEDs may be organized in an array or similar type of uniform pattern. In some embodiments, the light emitter 108 may be provided as a feedback mechanism for the electronic device 108 (e.g., as a user output) or the light emitter 108 may be used as a flash light, flash bulb, illumination source, or the like.

Figure 2:
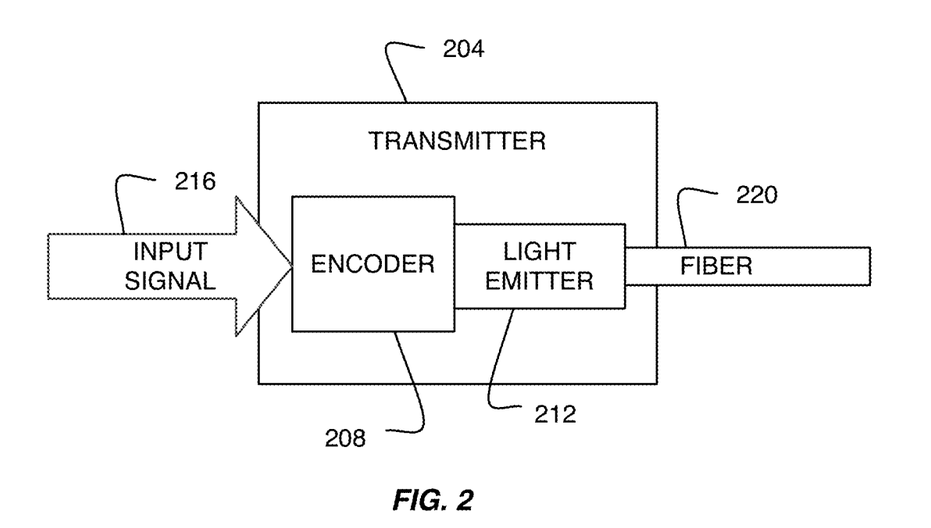
FIG. 2 is a block diagram depicting an optical transmitter used in a fiber optic communications network in accordance with embodiments of the present disclosure.

With reference now to FIG. 2, a more specific example of an electronic device having a light emitter will be described in accordance with embodiments of the present disclosure. In particular, FIG. 2 depicts a transmitter 204 comprising an encoder 208 and light emitter 212. The light emitter 212 may be the same or similar to the light emitter 108.

The transmitter 204 may be configured to transmit optical signals over a fiber optic cable 220. More specifically, the transmitter 204 may correspond to a transmitter component of an optical communications network. The transmitter 204 may be a stand-alone transmitter or may be part of a device comprising both transmitter and receiver capabilities. The transmitter 204 may be configured to receive an input signal 216 in the form of an electrical signal. The encoder 208 may be configured to prepare and send optical signals representative of the received input signal 216 via the light emitter 212. The optical signals can be transmitted via the optical fiber 220 where they are ultimately received at the other end of the optical fiber 220.

The specific configuration of a light emitter 212 as disclosed herein may benefit the transmitter 204 in an optical communications network. For instance, the light emitter 212 may comprise a plurality of different light sources in close proximity to one another, each being configured to emit light of a different frequency/wavelength. Given the close proximity of the light sources in the light emitter 212, light from each light source can be coupled into a single fiber 220, thereby allowing the fiber to carry multiple wavelengths of light at substantially the same time. This may enable the transmitter 204 to transmit data at a rate of 5 Gbps or more.

Figure 3A:
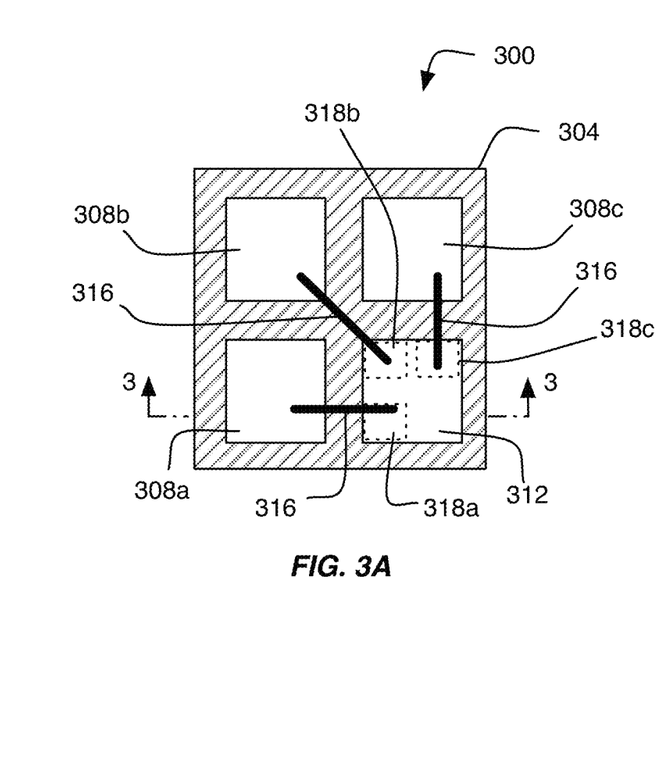
FIG. 3A is a top view of an illustrative light emitter in accordance with embodiments of the present disclosure.
Figure 3B:
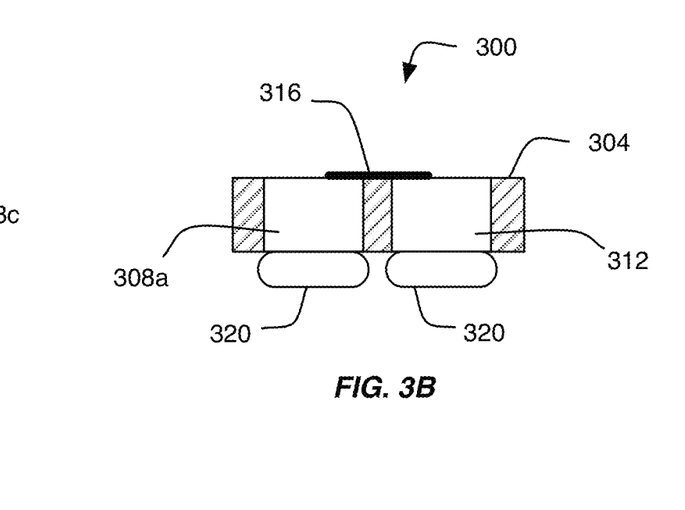
FIG. 3B is a cross-sectional view of the light emitter along line 3-3 of FIG. 3A.
Figure 3C:
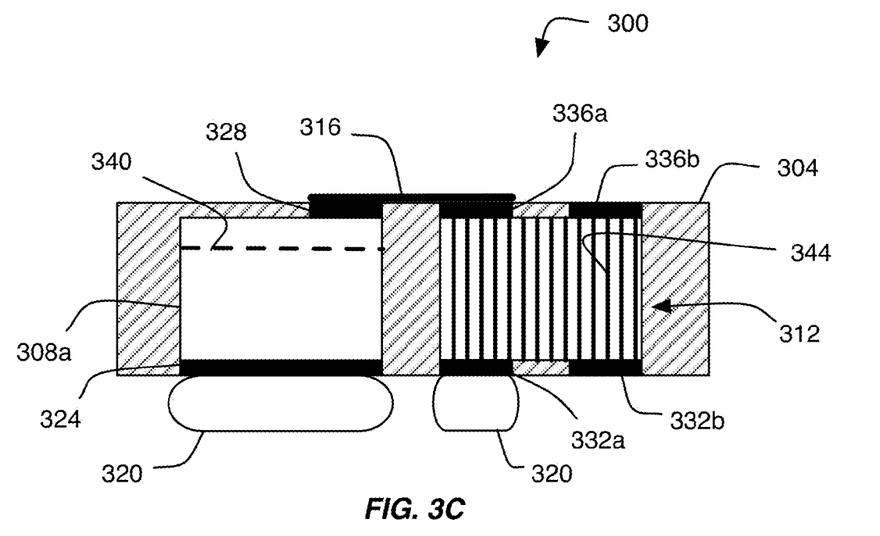
FIG. 3C is a detailed cross-sectional view of the light emitter along line 3-3 of FIG. 3A.

With reference now to FIGS. 3A-C, additional details of a light emitter 300 will be described in accordance with embodiments of the present disclosure. The light emitter 300 may correspond to a light emitter 108 incorporated into an electronic device 104 and/or a light emitter 212 incorporated into an optical data transmitter 204. It should also be appreciated that a plurality of light emitters 300 may be used to achieve the light emitters 108 and/or 212.

The depicted light emitter 300 is shown to include a mold material 304, a plurality of discrete light sources 308a, 308b, 308c, and a jumper chip 312. In some embodiments, the total area of the light emitter 300 may be between 500 to 600 microns when the light emitter 300 comprises three light sources 308a, 308b, 308c and a jumper chip 312. The height or thickness of the light emitter 300 (excluding solder balls 320) may be on the order of 50 microns or less. In some embodiments, the light emitter 300 is constructed without the need for a carrier or substrate. Instead, the light sources 308a, 308b, 308c and jumper chip 312 are integrated into a single piece of mold material 304 to achieve a wafer-like format. This extremely thin wafer can then have solder balls 320 applied thereto to enable electrical connections with external circuits (e.g., driver circuits, power sources, etc.). As a non-limiting example, the light emitter 300 can be constructed using a photolithography process where the electrical contacts 316 between each light source 308a, 308b, 308c and the jumper chip 312 is achieved by via evaporation, sputtering, etching, grinding, polishing, diffusion, photolithography, or any other type of wafer manufacturing process, thereby facilitating the creation of small and precise electrical contacts 316.

The electrical contacts 316 can be processed on isolating layers like SiO2, Si3N4 or the like. In some embodiments, the electrical contacts 316 can be further formed using traditional wafer processing techniques such as Chemical Vapor Deposition (CVD), Atomic Layer Deposition (ALD), sputtering, photolithography, etc. Electrical contact lanes can cross each other without a short cut. Moreover, a light source 308a, 308b, or 308c can be physically contacted to the jumper chip 312 at a selected bonding area 318a, 318b, 318c jumper contact even if the electrical contact lane would cross over one of the other bonding areas 318a, 318b, 318c for another light source. This cross-over feature can be achieved since the jumper chip 312 exhibits an isolation layer that could prevent electrical contact between the different light sources.

In the embodiment depicted in FIG. 3A, the light sources 308a, 308b, 308c and jumper chip 312 are configured in a square arrangement and each light source 308a, 308b, 308c terminates with the jumper chip 312 in a different bonding area 318a, 318b, 318c, respectively, of the jumper chip 312. More specifically, the first light source 308a is depicted as having an electrical contact 316 extend from the first light source 308a across the top of the mold material 304 and connect with the jumper chip 312 at a first bonding area 318a. Similarly, the second light source 308b is depicted as having an electrical contact 316 extend from the second light source 308b across the top of the mold material 304 and connect with the jumper chip 312 at a second bonding area 318b. Finally, the third light source 308c is depicted as having an electrical contact 316 extend from the third light source 308c across the top of the mold material 304 and connect with the jumper chip 312 at a third bonding area 318c. As will be discussed in further detail with reference to FIG. 3C, the jumper chip 312 may be configured with a plurality of different discrete bonding areas 318a, 318b, 318c that are electrically isolated from one another. This electrical isolation of bonding areas 318a, 318b, 318c may be achieved by preparing the jumper chip 312 with Through Silicon Via (TSV) or Through Silicon Wire (TSW) technology. More specifically, the jumper chip 312 may comprise a plurality of electrically isolated conductive vias extending therethrough and different parts of the jumper chip 312 may be electrically isolated from other parts of the jumper chip 312 due to the existence of insulative materials between each conductive via.

Each light source 308a, 308b, 308c may correspond to an LED or bare LED die. More specifically, the light sources 308a, 308b, 308c may correspond to bare LED dies and each light source 308a, 308b, 308c may be configured to emit light of a different wavelength. As a non-limiting example, the first light source 308a may be a red LED die (e.g., configured to emit light at a wavelength between approximately 600 nm and 800 nm), the second light source 308b may be a green LED die (e.g., configured to emit light at a wavelength between approximately 500 nm and 550 nm), and the third light source 308c may be a blue LED die (e.g., configured to emit light at a wavelength between approximately 400 nm and 500 nm). In other configurations, the light sources 308a, 308b, 308c may be configured to emit white light or any other color of light or combination of colors. In still other embodiments, the light sources 308a, 308b, 308c may comprise bare LED dies, laser diodes, photodiodes, photodiode ICs, VCSELs, or combinations thereof. Furthermore, while FIG. 3A shows the light emitter 300 as comprising three light sources 308a, 308b, 308c, it should be appreciated that a greater or lesser number of light sources may be included in a light emitter 300 without departing from the scope of the present disclosure.

The mold material 304 may correspond to an electrically-insulative material that is used to fix the relative position of the light sources 308a, 308b, 308c and jumper chip 312. The mold material 304 may also be advantageously used to support the electrical contacts 316 that extend between the light sources 308a, 308b, 308c and the jumper chip 312. Further still, the mold material 304 may be structurally sufficient to act as a carrier for the light sources 308a, 308b, 308c and jumper chip 312. In some embodiments, the combination of the mold material 304, light sources 308a, 308b, 308c, and jumper chip 312 may be referred to as a light package. Non-limiting examples of materials that may be used for the mold material 304 include black plastic, white plastic, transparent plastic, translucent plastic, silicon, or any other non-conductive material.

As shown in FIG. 3B and in further detail in FIG. 3C, solder balls 320 may provide a connection between the light sources 308a, 308b, 308c and jumper chip 312 to external circuitry. Thus, the entire light emitter 300 does not need bonding wires, which are known to be fragile, difficult to connect, and often serve as the first point of failure in light packages. Furthermore, without the need for bonding wires, the overall size of the light emitter 300 can be kept extremely small; in particular, the height of the light emitter 300 can be significantly reduced as compared to existing light packages. Specifically, the light emitter 300 can be maintained as a wafer.

While FIGS. 3B and 3C only show one of the light sources (e.g., the first light source 308a), it should be appreciated that each of the light sources may be manufactured in a similar fashion to the depicted light source. FIG. 3C shows in particular that a light source may comprise a bottom contact pad 324 and a top contact pad 328. One of the contact pads of the light source may correspond to an n-type contact and the other of the contact pads of the light source may correspond to a p-type contact. To use a different terminology, one of the contact pads of the light source may correspond to an anode of the light source and the other of the contact pads of the light source may correspond to a cathode of the light source. As is known in the LED arts, the light source may correspond to a bare LED die having its contacts on its opposing sides. It could also be conceivable to use light sources with both an anode and cathode on a common side of the die, although such an embodiment is not depicted herein.

In some embodiments, each light source 308a, 308b, 308c may also comprise an active area 340. When the light source is an LED die, the active area 340 may correspond to a PN-junction, which is the area of light creation within the LED die once current (or a voltage difference) is applied to the contacts 324, 328. In the depicted embodiment, the bottom contact pad 324 of the light source 308a is connected to a solder ball 320 while the top contact pad 328 of the light source 308a is exposed at the top of the package and connected to the electrical contact 316. Some LEDs also use carrier substrates during production like Sapphire as the active area and the III-V material of light production (e.g., PN-junction) is very thin. In such case, the LEDs could also be mounted up-side up and during a grinding process the carrier substrate for the LEDs can be removed. The solder balls 320 can then be placed either on the front side or on the backside; in other words, the LED light emission can be on the front side or on the back side or both. It may even be possible to utilize a light source that emits light in all directions. In such a scenario, the mold material 304 may be transparent or translucent to maximize light output from the light emitter 300.

Similar to the light source 308a, the jumper chip 312 may comprise top and bottom contact pads; however, the jumper chip 312 may comprise a plurality of bottom contact pads and a plurality of top contact pads. The cross-sectional view of FIG. 3C shows two pairs of contact pads for the jumper chip 312, but it should be appreciated that the jumper chip 312 may comprise two, three, four, or more pairs of bottom/top contact pads, where each pair of bottom/top contact pads positioned directly across the body of the chip 312 from one another create different bonding areas 318a, 318b, 318c. Thus, the first bottom contact pad 332a and the first top contact pad 336a may be electrically connected to one another the one or more isolated conductive vias 344 extending through the body of the jumper chip 312. This may result in the first top contact pad 336a acting as the first bonding area 318a to which the first light source 308a is connected. The second bottom contact pad 332b and second top contact pad 336b may create a fourth bonding area not depicted in FIG. 3A. This fourth bonding area may not be utilized or connected to a light source. Again, the solder ball 320 may be connected to one or multiple of the bottom contact pads 332a. In other words, a solder ball 320 may be connected to a single bottom contact pad as shown in FIG. 3A or a solder ball may be connected to multiple bottom contact pads. In yet another alternative arrangement, the jumper chip 312 may comprise many different top contact pads 336, one for each bonding area 318, but the jumper chip 312 may only comprise a single bottom contact pad 332 that is common to all of the top contact pads 336. The top contact pads 336a may be used to connect to the electrical contact 316, thereby serving as the connection point with a light source.

In accordance with at least some embodiments of the present disclosure, the body of the jumper chip 312, and more specifically the isolated conductive vias 344 extending through the body of the jumper chip 312 may be constructed using TSV or TSW technologies. As an example, the body of the jumper chip 312 may be constructed of silicon, glass, or any other material used in the TSV arts. The conductive material established within a via may include one or more of copper, gold, aluminum, etc. and the conductive material may be deposited within the vias using known deposition techniques such as CVD, ALD, sputtering, or the like. One or many conductive vias may carry current between a bottom contact pad 332 and its opposing or corresponding top contact pad 336. However, since each conductive via 344 is isolated from all other vias in the jumper chip 312, the different top contact pads 336a, 336b and bottom contact pads 332a, 332b can be electrically isolated from one another.

As can be appreciated, the size of the light emitter 300 can be kept to a minimum because no bonding wires are needed. Instead, all of the electrical contacts 316 for the light emitter 300 are established on a single side of the package, while the other side of the package is connected to external circuitry via one or more solder balls 320. The final product has no carrier expect the mold material 304 to keep the light sources 308a, 308b, 308c and jumper chip 312 in place.

Figure 4A:
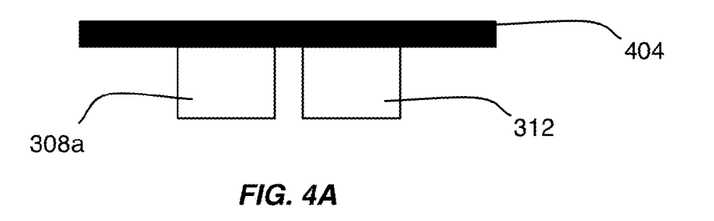
FIG. 4A depicts a first stage of manufacturing a light emitter in accordance with embodiments of the present disclosure.

With reference now to FIGS. 4A-E, an illustrative method of manufacturing a light emitter 300 or plurality of light emitters simultaneously (e.g., using a batch processing method) will be described in accordance with embodiments of the present disclosure. The first stage of manufacturing is depicted in FIG. 4A whereby individual light sources 308a, 308b, 308c (e.g., bare LED dies) and the jumper chip 312 are mounted or attached to a carrier 404. In some embodiments, the carrier 404 may correspond to a foil, tape, or the like. The light sources 308a, 308b, 308c and jumper chip 312 may be attached to the carrier 404 sequentially or simultaneously.

Figure 4B:
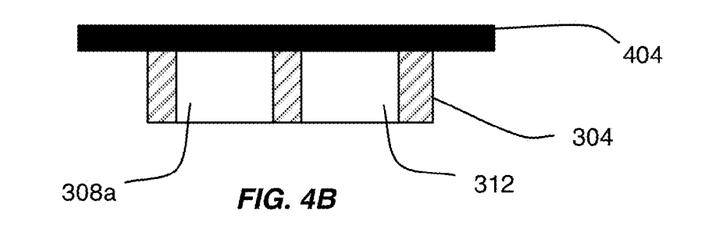
FIG. 4B depicts a second stage of manufacturing a light emitter in accordance with embodiments of the present disclosure.
Figure 4C:
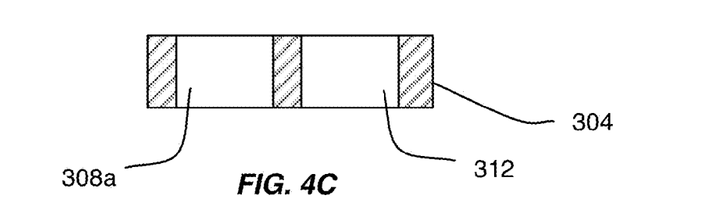
FIG. 4C depicts a third stage of manufacturing a light emitter in accordance with embodiments of the present disclosure.

With the light sources 308a, 308b, 308c and jumper chip 312 connected to the carrier 404, the mold material 304 is provided around the light sources 308a, 308b, 308c and the jumper chip 312 (see FIG. 4B). The mold material 304 is then cured, allowed to set, harden, etc. and then the carrier 404 can be removed (See FIG. 4C). In some embodiments, the carrier 404 and components connected thereto can be over molded such that once the mold material 304 is allowed to harden, the components (e.g., light sources and jumper chip 312) are held together via the mold material 304. Once the carrier 404 is removed, an artificial wafer has been created. At this point, processing of the light emitter can utilize known semiconductor wafer-processing techniques.

Figure 4D:
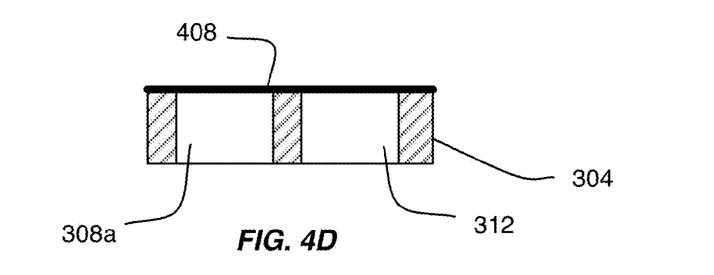
FIG. 4D depicts a fourth stage of manufacturing a light emitter in accordance with embodiments of the present disclosure.
Figure 4E:
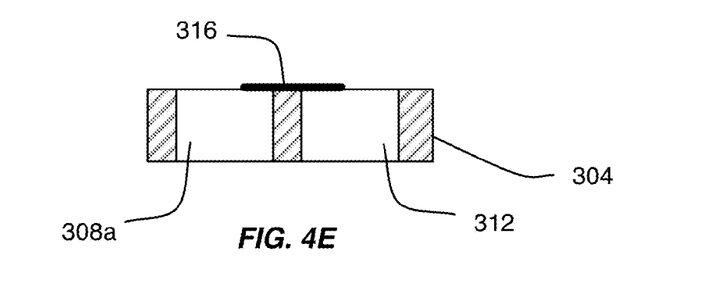
FIG. 4E depicts a fifth stage of manufacturing a light emitter in accordance with embodiments of the present disclosure.

Thus, as shown in FIG. 4D, a conductive layer 408 is applied to a top or bottom side of the mold material 304 and components contained therein. This conductive layer 408 may comprise aluminum, gold, copper, silver, combinations thereof, or any other known conductive material. To isolate the conductive layers, materials like SiO2, Si3N4 or other isolation layers may be produced with semiconductor processes as described. The conductive layer 408 may be applied using any type of known deposition technique such as sputtering, CVD, ALD, or the like. Once applied, unnecessary portions of the conductive layer 408 may be removed, thereby leaving only the electrical contacts 316 as shown in FIG. 4E. In some embodiments, masking, etching, laser etching, or the like may be used to remove unnecessary portions of the conductive layer 408 and the remaining portions of the conductive layer 408 may correspond to the electrical contacts 316 between the light sources 308a, 308b, 308c and the jumper chip 312. The electrical contacts 316 may be only a couple of microns thick and is fully supported by the mold material 304 and components molded therein.

In some embodiments, other semiconductor processing techniques may be employed to further enhance the functionality of the light emitter 300. As one non-limiting example, an antireflection (AR) coating layer may be applied to some or all of the light sources or light receivers (e.g., on light-emitting surfaces of the light sources 308a, 308b, 308c). As another non-limiting example, a CMOS chip or any other multi-chip arrangement can be accommodated for the light emitter 300. Finally, the light emitter 300 can be shipped to a producer of electronic devices 104, 204 such that the light emitter 300 can be incorporated therein.

Figure 5:
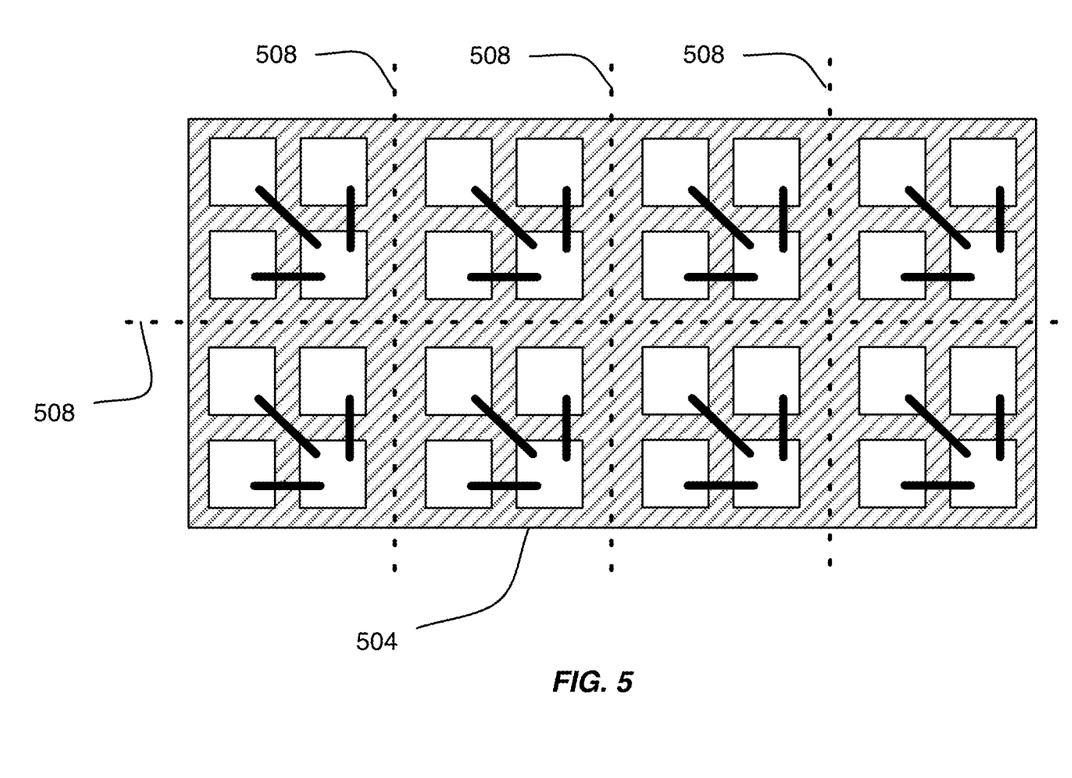
FIG. 5 depicts a plurality of light emitters in a first wafer form in accordance with embodiments of the present disclosure.

As discussed above, it may be possible to manufacture a plurality of light emitters 300 at substantially the same time. FIG. 5 depicts one possible wafer configuration where bulk mold material 504 contains a plurality of groupings of light sources and jumper chips. The configuration of FIG. 5 can be used to prepare a plurality of light emitters 300 as described in connection with FIGS. 3A-C and 4A-E. Specifically, the groups of components may be molded with the mold material 504 at substantially the same time to achieve a wafer with a plurality of light emitters. The wafer may then be diced or singulated along dicing traces 508 such that a plurality of individual light emitters 300 are obtained.

Figure 6:
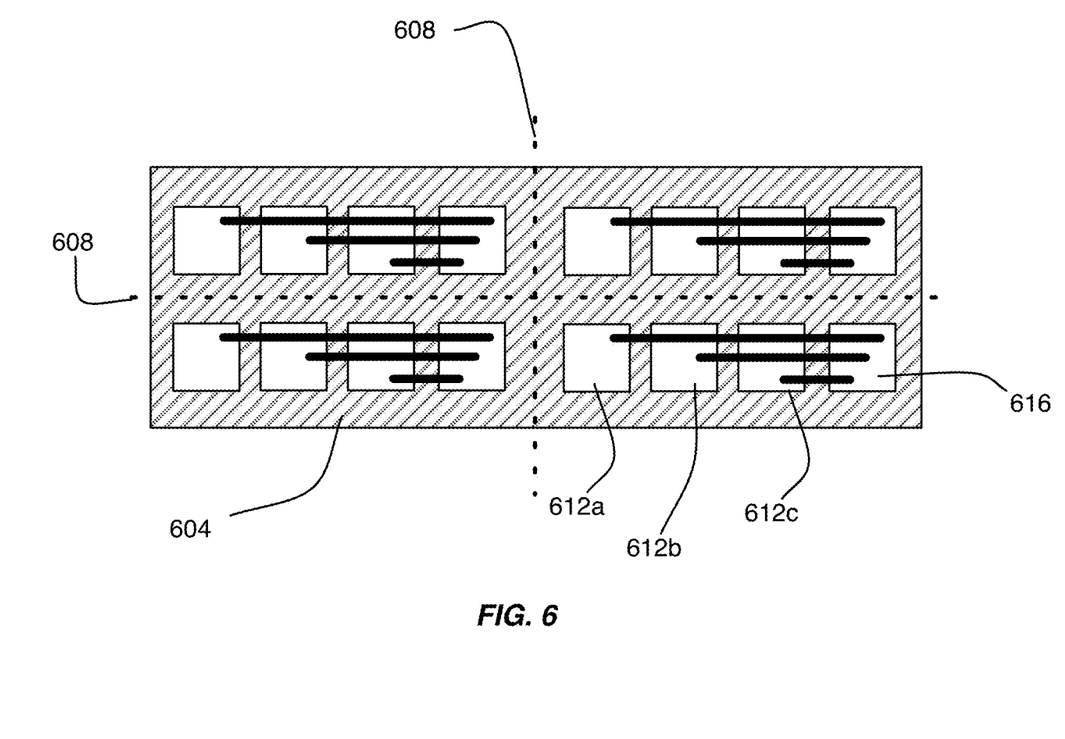
FIG. 6 depicts a plurality of light emitters in a second wafer form in accordance with embodiments of the present disclosure.

FIG. 6 depicts another possible wafer configuration whereby bulk mold material 604 fixes the components of the light emitter is a different arrangement. Specifically, rather than being in a square or rectangular configuration, the components are arranged linearly such that the three light sources 612a, 612b, 612c are arranged next to the jumper chip 616. It should be appreciated that the light sources 612a, 612b, 612c may be similar or identical to light sources 308a, 308b, 308c and the jumper chip 616 may be similar or identical to jumper chip 312, but for the relative orientation of the components.

As with the other light emitter 300, the light emitters obtained by utilizing this type of wafer configuration are relatively smaller wafer-like products. Furthermore, all of the electrical contacts are established on the common side of the wafer. Once the processing steps (e.g., the steps of FIGS. 4A-E) are completed, the plurality of light emitters may be singulated from the wafer by cutting the mold material 604 along the dicing traces 608.

Figure 7:
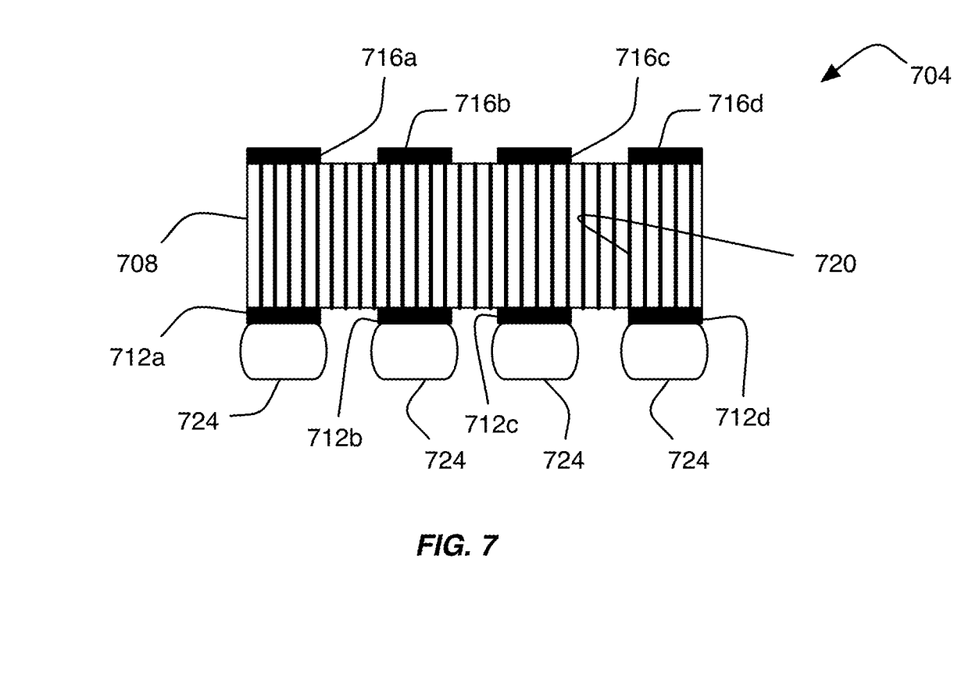
FIG. 7 is a cross-sectional view of a jumper chip in accordance with embodiments of the present disclosure.

FIG. 7 depicts a cross-sectional view of a jumper chip 704 that may be used in the wafer configuration depicted in FIG. 6. Specifically, the jumper chip 704 may comprise a body 708 having a plurality of isolated conductive vias 720 therein, a plurality of bottom contact pads 712a, 712b, 712c, 712c and a plurality of corresponding top contact pads 716a, 716b, 716c, 716d. The components of the jumper chip 704 may be similar or identical to components of jumper chip 312, with the only difference being the location of the top and bottom contact pads (e.g., in a staggered linear relationship rather than a square relationship). As with jumper chip 312, the jumper chip 708 may be connected to external circuitry with solder balls 724 connected with one side of the chip 708. Also as with jumper chip 312, the jumper chip 704 may have a single bottom contact pad that is connected to a single solder ball 724 while still maintaining a plurality of different top contact pads.

Specific details were given in the description to provide a thorough understanding of the embodiments. However, it will be understood by one of ordinary skill in the art that the embodiments may be practiced without these specific details. In other instances, well-known circuits, processes, algorithms, structures, and techniques may be shown without unnecessary detail in order to avoid obscuring the embodiments.

While illustrative embodiments of the disclosure have been described in detail herein, it is to be understood that the inventive concepts may be otherwise variously embodied and employed, and that the appended claims are intended to be construed to include such variations, except as limited by the prior art.

What is claimed is:

1. A light emitter, comprising:
a first light source having a first contact pad and a second contact pad and an active area configured to emit light of a first predetermined wavelength when an electrical potential is applied across the first contact pad of the first light source and the second contact pad of the first light source;
a second light source having a first contact pad and a second contact pad and an active area configured to emit light of a second predetermined wavelength when an electrical potential is applied across the first contact pad of the second light source and the second contact pad of the second light source; and
a jumper chip comprising a first bonding area and a second bonding area that is electrically isolated from the first bonding area, wherein the first bonding area and second bonding area are created by a plurality of isolated conductive vias extending through a body of the jumper chip, wherein the first contact pad of the first light source is connected to the first bonding area of the jumper chip with a first electrical contact, wherein the first contact pad of the second light source is connected to the second bonding area of the jumper chip with a second electrical contact, and wherein the first and second electrical contacts correspond to the only connections between the first and second light sources and the jumper chip.

2. The light emitter of claim 1, wherein the first electrical contact comprises a thin conductive film deposited across the first contact pad of the first light source and the jumper chip and wherein the second electrical contact also comprises the thin conductive film deposited across the first contact pad of the second light source and the jumper chip.

3. The light emitter of claim 2, further comprising:
a mold material positioned around the first light source, the second light source, and the jumper chip thereby substantially fixing a relative position of the first light source, the second light source, and the jumper chip.

4. The light emitter of claim 3, wherein the first and second electrical contacts are also deposited across a top surface of the mold material.

5. The light emitter of claim 3, wherein the mold material comprises at least one of a black plastic, white plastic, transparent plastic, and translucent plastic.

6. The light emitter of claim 1, wherein the first light source comprises a first bare Light Emitting Diode (LED) die and wherein the second light source comprises a second bare LED die.

7. The light emitter of claim 6, wherein the first contact pad of the first light source corresponds to an anode or cathode of the first bare LED die, wherein the second contact pad of the first light source corresponds to a complimentary cathode or anode of the first bare LED die, wherein the first contact pad of the second light source corresponds to an anode or cathode of the second bare LED die, and wherein the second contact pad of the second light source corresponds to a complimentary cathode or anode of the second bare LED die.

8. The light emitter of claim 7, wherein the anodes and cathodes of the first and second bare LED dies are on opposing surfaces of the bare LED dies.

9. The light emitter of claim 3, wherein the first and second electrical contacts are provided on a common surface of the mold material.

10. The light emitter of claim 1, wherein the jumper chip comprises a body constructed with at least one of silicon and glass and wherein the isolated conductive vias comprise a conductive material extending through the body of the jumper chip.

11. The light emitter of claim 1, further comprising:
a third light source having a first contact pad and a second contact pad and an active area configured to emit light of a third predetermined wavelength when an electrical potential is applied across the first contact pad of the third light source and the second contact pad of the third light source, wherein the first contact pad of the third light source is connected to a third bonding area of the jumper chip with a third electrical contact.

12. The light emitter of claim 11, wherein the first, second, and third predetermined wavelengths are different from one another.

13. The light emitter of claim 1, wherein the first and second predetermined wavelengths are substantially the same.

14. A lighting package, comprising:
a jumper chip comprising a first pair of top and bottom contact pads and a second pair of top and bottom contact pads, the first pair of top and bottom contact pads being electrically isolated from the second pair of top and bottom contact pads, the first pair of top and bottom contact pads establishing a first bonding area on a top surface of the jumper chip, the second pair of top and bottom contact pads establishing a second bonding area on the top surface of the jumper chip;
a first light source comprising a top contact pad and bottom contact pad with an active area positioned therebetween such that electrical current flowing between the top and bottom contact pad of the first light source cause the active area to emit light of a predetermined wavelength, wherein the top contact pad of the first light source is connected to the first bonding area of the jumper chip by a first electrical contact in the form of a thin film conductive material, which corresponds to the only electrical connection between the jumper chip and the first light source; and
a mold material positioned between and around the jumper chip and the first light source, wherein the mold material provides a surface on which the first electrical contact is supported in addition to fixing the first light source relative to the jumper chip.

15. The lighting package of claim 14, wherein the jumper chip comprises a body constructed with at least one of silicon and glass and a plurality of isolated conductive vias extending through the body.

16. The lighting package of claim 15, wherein the plurality of isolated conductive vias are filled with a conductive material comprising at least one of gold, aluminum, and copper.

17. The lighting package of claim 14, wherein the first light source is a bare Light Emitting Diode (LED) and wherein the first light source and jumper chip each comprise a thickness of 50 microns or less.

18. The lighting package of claim 14, further comprising:
a second light source comprising a top contact pad and bottom contact pad with an active area positioned therebetween such that electrical current flowing between the top and bottom contact pad of the second light source cause the active area of the second light source to emit light of a predetermined wavelength, wherein the top contact pad of the second light source is connected to the second bonding area of the jumper chip by a second electrical contact in the form of the thin film conductive material.

19. An electronic device, comprising:

a light emitter comprising:

a jumper chip comprising a first pair of top and bottom contact pads and a second pair of top and bottom contact pads, the first pair of top and bottom contact pads being electrically isolated from the second pair of top and bottom contact pads, the first pair of top and bottom contact pads establishing a first bonding area on a top surface of the jumper chip, the second pair of top and bottom contact pads establishing a second bonding area on the top surface of the jumper chip;

a first light source comprising a top contact pad and bottom contact pad with an active area positioned therebetween such that electrical current flowing between the top and bottom contact pad of the first light source cause the active area to emit light of a predetermined wavelength, wherein the top contact pad of the first light source is connected to the first bonding area of the jumper chip by a single electrical contact in the form of a thin film conductive material; and a mold material positioned between and around the jumper chip and the first light source, wherein the mold material provides a surface on which the single electrical contact is supported in addition to fixing the first light source relative to the jumper chip.

20. The electronic device of claim 19, further comprising:

an encoder configured to generate optical communication signals by operating the light emitter; and a fiber optic interface.

21. The light emitter of claim 1, wherein the first light source, second light source, and jumper chip are arranged such that the second electrical contact passes over the first light source.

* * * * *